(12) United States Patent
Bouisse

(10) Patent No.: US 11,283,410 B2
(45) Date of Patent: Mar. 22, 2022

(54) NO-LOAD-MODULATION, HIGH-EFFICIENCY POWER AMPLIFIER

(71) Applicant: MACOM Technology Solutions Holdings, Inc., Lowell, MA (US)

(72) Inventor: Gerard Bouisse, Toulouse (FR)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 16/651,703

(22) PCT Filed: Oct. 2, 2017

(86) PCT No.: PCT/IB2017/001575
§ 371 (c)(1),
(2) Date: Mar. 27, 2020

(87) PCT Pub. No.: WO2019/069115
PCT Pub. Date: Apr. 11, 2019

(65) Prior Publication Data
US 2020/0259461 A1     Aug. 13, 2020

(51) Int. Cl.
*H03F 1/02* (2006.01)
*H03F 1/32* (2006.01)
(Continued)

(52) U.S. Cl.
CPC .............. *H03F 1/0288* (2013.01); *H03F 1/32* (2013.01); *H03F 1/42* (2013.01); *H03F 3/245* (2013.01); *H03F 2200/451* (2013.01)

(58) Field of Classification Search
CPC . H03F 1/0288; H03F 1/42; H03F 3/20; H03F 3/211; H03F 1/32; H03F 3/245; H03F 2200/451
See application file for complete search history.

(56) References Cited

U.S. PATENT DOCUMENTS

| 6,085,074 A | 7/2000 | Cygan |
| 6,791,417 B2 | 9/2004 | Pengelly et al. |

(Continued)

FOREIGN PATENT DOCUMENTS

| EP | 2 698 918 A1 | 2/2014 |
| EP | 2 806 557 A1 | 11/2014 |

(Continued)

OTHER PUBLICATIONS

U.S. Appl. No. 16/607,079, Bouisse, Oct. 21, 2019.
(Continued)

*Primary Examiner* — Raymond S Dean
(74) *Attorney, Agent, or Firm* — Thomas | Horstemeyer, LLP.; Jason M. Perilla

(57) ABSTRACT

Apparatus and methods for a multiclass, broadband, no-load-modulation power amplifier are described. The power amplifier (500) may include a main amplifier (532) operating in a first amplification class and a plurality of peaking amplifiers (536, 537, 538) operating in a second amplification class. The main amplifier (532) and peaking amplifiers (536, 537, 538) may operate in parallel on portions of signals derived from an input signal to be amplified. The main amplifier (532) may see no modulation of its load impedance between a fully-on state of the power amplifier (all amplifiers amplifying) and a fully backed-off state (peaking amplifiers idle). By avoiding load modulation, the power amplifier (500) can exhibit improved bandwidth and efficiency compared to conventional Doherty amplifiers.

22 Claims, 6 Drawing Sheets

(51) Int. Cl.
*H03F 1/42* (2006.01)
*H03F 3/24* (2006.01)

(56) References Cited

U.S. PATENT DOCUMENTS

| | | | |
|---|---|---|---|
| 7,218,175 | B1 | 3/2007 | Kobasyashi |
| 9,071,211 | B1* | 6/2015 | Ozard ................. H01P 5/12 |
| 9,621,115 | B1 | 4/2017 | Wu |
| 9,667,199 | B1 | 5/2017 | Mclaren |
| 9,966,903 | B1* | 5/2018 | McLaren .............. H03F 3/211 |
| 2003/0137346 | A1 | 7/2003 | Hellberg ............. H03F 1/0288 |
| | | | 330/124 R |
| 2003/0141933 | A1 | 7/2003 | Pengelly |
| 2006/0097783 | A1 | 5/2006 | Okubo et al. |
| 2007/0205827 | A1* | 9/2007 | Mobbs ................ H03F 3/602 |
| | | | 330/124 R |
| 2012/0025915 | A1 | 2/2012 | Ui |
| 2012/0092074 | A1 | 4/2012 | Yanduru et al. |
| 2012/0105147 | A1 | 5/2012 | Harris et al. |
| 2013/0093534 | A1 | 4/2013 | Mei |
| 2013/0154729 | A1 | 6/2013 | Folkmann et al. |
| 2014/0132343 | A1 | 5/2014 | Colantonio et al. |
| 2014/0146917 | A1* | 5/2014 | Muhammad ......... H04B 1/0475 |
| | | | 375/297 |
| 2015/0002227 | A1 | 1/2015 | Pribble et al. |
| 2015/0002230 | A1* | 1/2015 | Qureshi .............. H03F 1/483 |
| | | | 330/295 |
| 2015/0180428 | A1 | 6/2015 | Pham et al. |
| 2016/0036398 | A1 | 2/2016 | Li |
| 2016/0268976 | A1* | 9/2016 | Negra ................ H03F 1/0211 |
| 2016/0336903 | A1 | 11/2016 | Ahmed et al. |
| 2017/0019071 | A1 | 1/2017 | Kobasyashi et al. |
| 2017/0070193 | A1 | 3/2017 | Juang et al. |
| 2017/0085228 | A1 | 3/2017 | Abdo et al. |
| 2017/0163221 | A1 | 6/2017 | Takagi et al. |
| 2018/0034418 | A1* | 2/2018 | Blednov .............. H03F 3/211 |
| 2018/0034419 | A1* | 2/2018 | Moronval ............ H03F 1/565 |
| 2018/0183388 | A1 | 6/2018 | Pham |
| 2018/0191309 | A1 | 7/2018 | Mclaren |
| 2018/0254748 | A1 | 9/2018 | Grebennikov et al. |
| 2019/0036487 | A1* | 1/2019 | Jiang ................ H03F 3/602 |
| 2019/0356277 | A1 | 11/2019 | Bouisse et al. |
| 2020/0212847 | A1* | 7/2020 | Pham ................ H03F 3/195 |
| 2021/0013572 | A1 | 1/2021 | Zhu |

FOREIGN PATENT DOCUMENTS

| | | |
|---|---|---|
| EP | 2 876 810 A1 | 5/2015 |
| EP | 3 121 960 A1 | 1/2017 |
| EP | 3 133 735 A1 | 2/2017 |
| EP | 3 179 628 A2 | 6/2017 |
| EP | 3 179 638 A2 | 6/2017 |
| WO | WO 2009/027916 A2 | 3/2009 |
| WO | WO 2017/192075 A1 | 11/2017 |

OTHER PUBLICATIONS

U.S. Appl. No. 16/639,105, Pham et al., Feb. 13, 2020.
U.S. Appl. No. 16/607,081, Cassou, Oct. 21, 2019.
U.S. Appl. No. 16/607,083, Bouisse et al., Oct. 21, 2019.
U.S. Appl. No. 16/593,072, Pham et al., Oct. 4, 2019.
U.S. Appl. No. 16/530,293, Bouisse et al., Aug. 2, 2019.
International Search Report and Written Opinion for Application No. PCT/IB2017/000727 dated Oct. 19, 2017.
International Preliminary Report on Patentability for International Application No. PCT/IB2017/000727, dated Aug. 15, 2019.
International Search Report and Written Opinion for Application No. PCT/IB2017/000608, dated Sep. 8, 2017.
International Preliminary Report on Patentability for International Application No. PCT/IB2017/000608, dated Nov. 7, 2019.
Invitation to Pay Additional Fees for Application No. PCT/IB2017/000717 dated Oct. 6, 2017.
International Search Report and Written Opinion for Application No. PCT/IB2017/000717 dated Dec. 6, 2017.
International Preliminary Report on Patentability for International Application No. PCT/IB2017/000717, dated Aug. 15, 2019.
International Search Report and Written Opinion for Application No. PCT/IB2017/000722 dated Nov. 7, 2017.
International Preliminary Report on Patentability for International Application No. PCT/IB2017/000722, dated Aug. 15, 2019.
International Search Report and Written Opinion for Application No. PCT/US2017/068164 dated Mar. 13, 2018.
Written Opinion of the International Preliminary Examining Authority for Application No. PCT/US2017/068164 dated Dec. 5, 2018.
Ch. II International Preliminary Report on Patentability for International Application No. PCT/US2017/068164, dated Apr. 3, 2019.
International Search Report and Written Opinion for Application No. PCT/IB2018/046754 dated Nov. 22, 2018.
International Preliminary Report on Patentability for International Application No. PCT/IB2018/046754 dated Feb. 27, 2020.
International Search Report and Written Opinion for Application No. PCT/IB2017/001575 dated Jun. 18, 2018.
International Search Report and Written Opinion for Application No. PCT/IB2017/000639 dated Sep. 8, 2017.
International Preliminary Report on Patentability for International Application No. PCT/IB2017/000639, dated Nov. 7, 2019.
International Search Report and Written Opinion for Application No. PCT/IB2017/000604 dated Sep. 8, 2017.
International Preliminary Report on Patentability for International Application No. PCT/IB2017/000604 dated Nov. 7, 2019.
International Search Report and Written Opinion for International Application No. PCT/US2019/054686, dated Dec. 19, 2019.
Camarchia et al., 7 GHz MMIC GaN Doherty Power Amplifier With 47% Efficiency at 7 dB Output Back-Off. IEEE Microwave and Wireless Components Letters. Jan. 2013;23(1):34-6.
Campbell, A Fully Integrated Ku-Band Doherty Amplifier MMIC. IEEE Microwave and Guided Wave Letters. Mar. 1999;9(3):114-6.
Cidronali et al., Frequency Analysis and Multiline Implementation of Compensated Impedance Inverter for Wideband Doherty High-Power Amplifier Design. IEEE Transactions on Microwave Theory and Techniques. May 2016;64(5):1359-72.
Grebennikov et al., High-Efficiency Doherty Power Amplifiers: Historical Aspect and Modern Trends. Proceedings of the IEEE. Dec. 2012;100(12):3190-219.
Kim et al., Doherty Linear Power Amplifiers for Mobile Handset Applications. Proceedings of Asia-Pacific Microwave Conference. Dec. 2006;1885-94.
Merrick et al., A wideband sequential power amplifier. 2014 IEEE MTT-S International Microwave Symposium (IMS2014). Jun. 1, 2014:1-3.
Moronval et al., A 100 W Multi-Band Four-Way Integrated Doherty Amplifier. IEEE MTT-S International Microwave Symposium (IMS) May 22, 2016:1-3.
Quaglia et al., K-Band GaAs MMIC Doherty Power Amplifier for Microwave Radio With Optimized Driver. IEEE Transactions on Microwave Theory and Techniques. Nov. 2014;62(11):2518-25.
Roberts, Understanding the 3 Level Doherty. 11th European Microwave Integrated Circuits Conference (EUMIC), European Microwave Association. Oct. 3, 2016:428-32.
Wicks et al., A 60-GHz Fully-Integrated Doherty Power Amplifier Based on 0.13-µm CMOS Process. Radio Frequency Integrated Circuits Symposium. Jun. 17, 2008;69-72.
Yu et al., Fully Integrated Doherty Power Amplifiers for 5 GHz Wireless-LANs. IEEE Radio Frequency Integrated Circuits Symposium (RFIC). Jun. 11, 2006;153-6.
Zhou et al., Design of an S-Band Two-Way Inverted Asymmetrical Doherty Power Amplifier for Long Term Evolution Applications. Progress in Electromagnetics Research Letters. 2013;39:73-80.
Daehyun Kang et al: "30.3% PAE HBT Doherty power amplifier for 2.5~ 2.7 GHz mobile WiMAX", Microwave Symposium Digest (MTT), 2010 IEEE MTT-S International, IEEE, Piscataway, NJ, USA, May 23, 2010, pp. 796-799, XP031714062,ISBN: 978-1-4244-6056-4.

(56) References Cited

OTHER PUBLICATIONS

Ceylan et al., "Refine Biasing Networks for High PA Low Frequency Stability", Microwave & RF, Apr. 17, 2018, pp. 1-6 (Year: 2018).
Office Action for European Application No. 17825920.6 dated Dec. 1, 2021.

* cited by examiner

NO-LOAD-MODULATION, HIGH-EFFICIENCY POWER AMPLIFIER

RELATED APPLICATION

This Application is a national stage filing under 35 U.S.C. 371 of International Patent Application No. PCT/IB2017/001575, filed Oct. 2, 2017, entitled "NO-LOAD-MODULATION, HIGH-EFFICIENCY POWER AMPLIFIER," the entire contents of which is herein incorporated by reference in its entirety.

BACKGROUND

Technical Field

The technology relates to high-speed, high-power amplifiers which may be constructed from transistors formed from semiconductor materials such as, but not limited to, gallium nitride.

Discussion of the Related Art

High-speed power amplifiers formed from semiconductor materials have a variety of useful applications, such as radio-frequency (RF) communications, radar, RF energy, power conversion, and microwave applications. Gallium nitride semiconductor material has received appreciable attention in recent years because of its desirable electronic and electro-optical properties. Because of its wide bandgap, GaN is more resistant to avalanche breakdown and can maintain electrical performance at higher temperatures than other semiconductors, such as silicon. GaN also has a higher carrier saturation velocity and can sustain higher power densities compared to silicon. Additionally, GaN has a Wurtzite crystal structure, is a very stable and hard material, has a high thermal conductivity, and has a much higher melting point than other conventional semiconductors such as silicon, germanium, and gallium arsenide. Accordingly, GaN is useful for high-speed, high-voltage, and high-power applications.

Applications supporting mobile communications and wireless internet access under current and proposed communication standards, such as WiMax, 4G, and 5G, can place austere performance demands on high-speed amplifiers constructed from semiconductor transistors. The amplifiers may need to meet performance specifications related to output power, signal linearity, signal gain, bandwidth, and efficiency.

SUMMARY

Apparatus and methods for amplifying radio-frequency signals are described. A multiclass, no-load-modulation power amplifier may include a plurality of amplifiers operating in parallel on portions of a received signal in different amplification classes and providing amplified signals to a common output of the power amplifier. A main amplifier may amplify signals at low signal levels and high signal levels. Secondary amplifiers (referred to as peaking amplifiers) may be idle (non-amplifying) at low signal levels and become active (amplifying) as signal levels increase. The main amplifier may see a same impedance at its output regardless of whether the secondary amplifiers are idle or fully amplifying, thereby avoiding load modulation of the main amplifier that is typical with conventional Doherty amplifiers. The multiclass no-load-modulation power amplifier's peak efficiency may occur at deeper back-off powers than for conventional Doherty amplifiers.

Some embodiments relate to multiclass power amplifiers. A multiclass power amplifier may comprise a first amplifier in a first circuit branch arranged to operate in a first amplifier class, a second amplifier in a second circuit branch arranged to operate in a second amplifier class that is different from the first amplifier, and an impedance inverter configured to receive a combined output from the first amplifier and the second amplifier. The multiclass power amplifier may further include a third amplifier in a third circuit branch arranged to operate in the second amplifier class and a combining node configured to receive an output from the impedance inverter and the third amplifier and provide a combined output to an output port of the multiclass power amplifier for driving a load.

Some embodiments relate to methods of operating a multiclass power amplifier. A method may comprise acts of dividing a signal to be amplified into a first signal provided to a first circuit branch, a second signal provided to a second circuit branch, and a third signal provided to a third signal branch; amplifying, in the first circuit branch, the first signal with a first amplifier operated in a first amplifier class; amplifying, in the second circuit branch, the second signal with a second amplifier operated in a second amplifier class that is different from the first amplifier class; amplifying, in the third circuit branch, the third signal with a third amplifier operated in the second amplifier class; combining outputs from the first amplifier and the second amplifier and providing the combined outputs to an impedance inverter; combining, at a combining node, an output from the impedance inverter and an output from the third amplifier; and providing an output from the combining node to an output port of the multiclass power amplifier.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings.

Features and advantages of the illustrated embodiments will become more apparent from the detailed description set forth below when taken in conjunction with the drawings.

DETAILED DESCRIPTION

Figure 1:
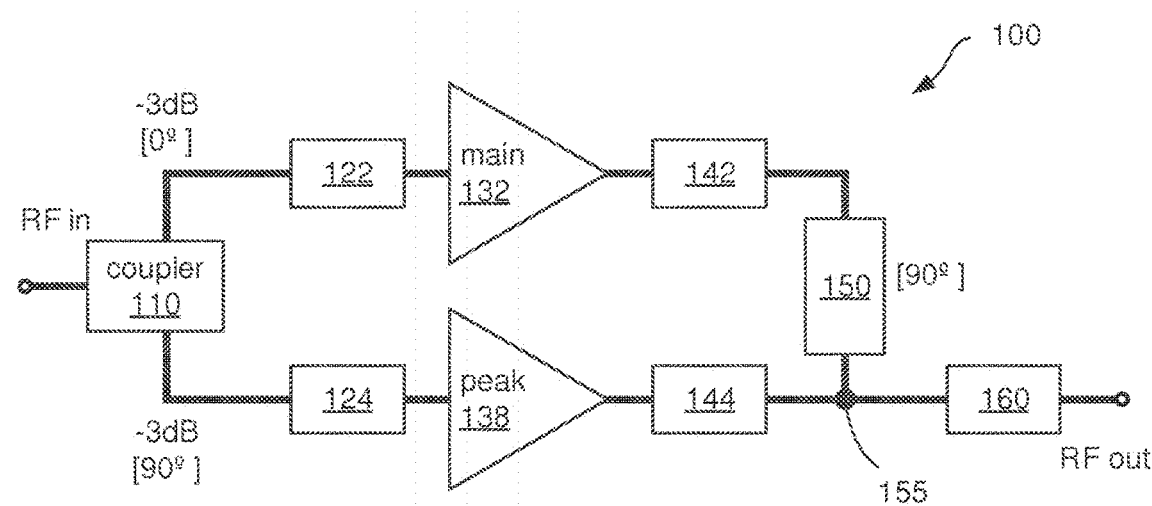
FIG. 1 depicts an arrangement of a Doherty amplifier.

One approach to amplifying signals to high power levels for communications is to use a Doherty amplifier, which is depicted schematically in FIG. 1. To aid in understanding the present technology, a summary of Doherty amplification is provided.

A Doherty amplifier 100 may comprise a main power amplifier 132 and a peaking power amplifier 138 that operate in parallel on a signal divided into parallel circuit branches. The peaking amplifier 138 is typically idle (not amplifying) at low signal levels, and turns on when the main amplifier 132 begins to saturate. Outputs from the two amplifiers are subsequently combined into a single RF output.

In further detail, a 90-degree power coupler 110 divides a received RF signal into two outputs that connect to inputs of the main amplifier 132 and the peaking amplifier 138. The power coupler 110 also delays (by approximately 90 degrees) the phase of the signal provided to the peaking amplifier with respect to the phase of the signal provided to the main amplifier. Impedance-matching elements 122, 124 may be placed before the main amplifier 132 and peaking amplifier 138. These impedance-matching elements can transform impedances so as to match the input impedances of the two amplifiers 132, 138 to the impedances of the transmission lines from the 90-degree coupler 110 or an output impedance of the coupler 110. Such impedance matching can reduce undesirable effects of signal reflections from the amplifier inputs.

Additional impedance-matching elements 142, 144 may be located at the outputs of the main amplifier 132 and peaking amplifier 138 to match impedances between the output of the main amplifier 132 to the input of an impedance inverter 150 (which may be 50 ohms by design) and between the output of the peaking amplifier 138 and an impedance at the combining node 155 (which may also be 50 ohms). The impedance inverter 150 rotates the phase of the signal received from the main amplifier 132 by approximately 90 degrees, so that the signals from the main amplifier and peaking amplifier will be essentially in phase at the combining node 155. An output impedance-matching element 160 may be used between the combining node 155 and the Doherty amplifier's RF output to match the output impedance of the Doherty amplifier 100 to an impedance of a load (not shown).

In a symmetric Doherty amplifier, the main amplifier 132 and peaking amplifier 138 may be closely similar or identical semiconductor devices. For example, they may be configured to handle a same amount of signal power and amplify a signal to a same power level when both amplifiers are fully amplifying at their upper limit (e.g., a fully-on state of the Doherty amplifier). Because the input power is split equally to the two amplifiers, the signal to the main amplifier 132 is typically attenuated by 3 dB at an output port of the coupler 110 compared to the input RF signal. Signal values expressed in "dB" refer to relative power levels.

Figure 2A:
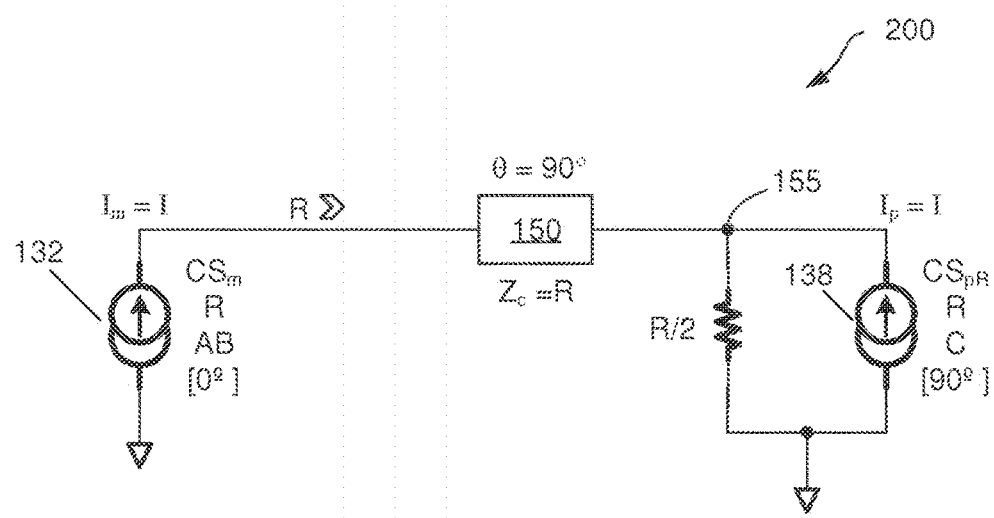
FIG. 2A depicts a circuit model for a symmetrical Doherty amplifier when a main amplifier and peaking amplifier are fully amplifying.

Operational aspects of a Doherty amplifier are illustrated in further detail in FIG. 2A through FIG. 4. FIG. 2A is a simplified circuit model for a Doherty amplifier when both the main amplifier 132 and peaking amplifier 138 are fully on (amplifying their respective signals at full-power values). The main amplifier 132 operating in class AB mode and its output impedance-matching element 142 may be modeled as a current source $CS_m$ having an internal impedance R and providing no phase delay to the amplified signal. The peaking amplifier 138 operating in class C mode, its output impedance-matching element 144, and the phase delay of the coupler 110 may be modeled as a second current source $CS_p$ having an internal impedance R, but providing a 90-degree phase delay to amplified signals. The impedance inverter 150 may be modeled as a transmission line having a characteristic impedance of R and providing a phase delay of 90 degrees. According to some embodiments, a load driven by the Doherty amplifier may have an impedance of R/2.

The phase delays described herein are delays for a carrier wave of a radio-frequency signal that is modulated to encode information onto the carrier wave. For example, a carrier wave may oscillate at a frequency having a value in a range between 0.7 gigaHertz (GHz) and 7 GHz, depending on what communication protocol is being used (e.g., 2G, 3G, 4G, etc.). The main amplifier 132 and peaking amplifier 138 may be designed for a particular carrier frequency and communication protocol. As one non-limiting example, an amplifier configured to handle signals for 4G communications may be designed for a carrier frequency of 2.6 GHz according to one protocol, and the specified phase delays of amplifier components are relative to 2.6 GHz. As another non-limiting example, an amplifier configured to handle signals for 4G communications may be designed for a carrier frequency of 1.9 GHz according to another protocol, and the specified phase delays of amplifier components are relative to 1.9 GHz.

When both the main amplifier 132 and peaking amplifier 138 are active and driving a load of R/2 with approximately equal amounts of current I (a fully-on state), as depicted in FIG. 2A, straightforward calculations show that the main amplifier 132 sees an impedance R at its output, as indicated by the chevron symbol in FIG. 2A. This is referred to as a "1:1 load" condition for the Doherty amplifier. This impedance value can be calculated in a two-step process. First, the impedance seen looking into the combining node 155 from the impedance inverter 150 is calculated. Second, the impedance looking into the combining node is transformed according to the property of the quarter-wave impedance inverter 150 to find an impedance (in this case R) looking into the impedance inverter 150.

Figure 2B:
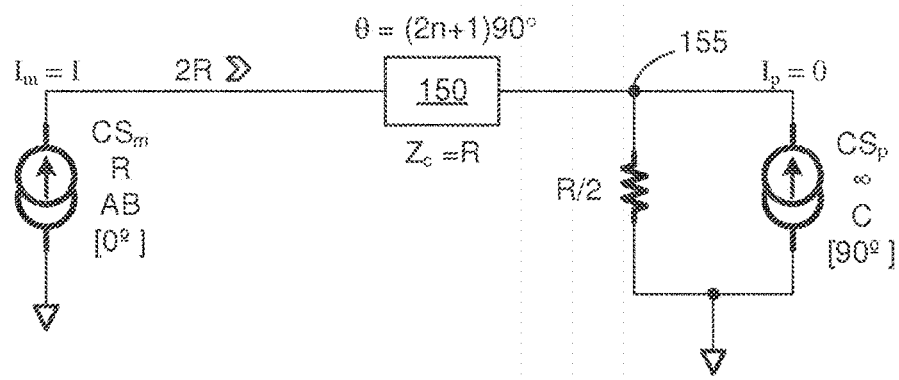
FIG. 2B depicts a circuit model for a symmetrical Doherty amplifier when a main amplifier is active and a peaking amplifier is idle (non-amplifying)

FIG. 2B depicts a circuit model for an operating condition of the Doherty amplifier in a fully backed-off state when the peaking amplifier 138 is idle (non-amplifying). When an input RF signal to be amplified by the Doherty amplifier falls below a threshold value, the peaking amplifier 138 becomes idle (non-amplifying) and is modeled essentially as an open circuit. For this model, the impedance of the peaking amplifier changes from R to an infinite value in an idle state. Recalculating impedances looking into the combining node 155 and looking into the impedance inverter 150 from the main amplifier shows that the impedance value seen looking into the impedance inverter 150 rises to 2R in the fully backed-off state. This operating condition is referred to as the "2:1 load" condition of the Doherty amplifier. In this case, the main amplifier's impedance R is no longer well matched to the impedance it is trying to drive. Such a mismatch can lead to signal reflections and inefficient operation of the Doherty amplifier.

The variation in impedance seen by the main amplifier 132 that depends on the state of the peaking amplifier 138 (which is determined by the input RF signal level) is referred to as "load modulation." Load modulation necessarily adversely affects power-handling capability of the amplifier and the amplifier's RF fractional bandwidth. For example, mismatches in impedance cause power reflections, and such reflections to the main amplifier may constrain the safe operating limit of the main amplifier appreciably below a power level that it could otherwise handle if there were no power reflections. The amount of reflected power may further depend on frequency, and changes in reflected power with frequency can take an amplifier out of compliance with a specification more quickly (resulting in a narrower bandwidth) than if there were no reflected power.

Figure 3:
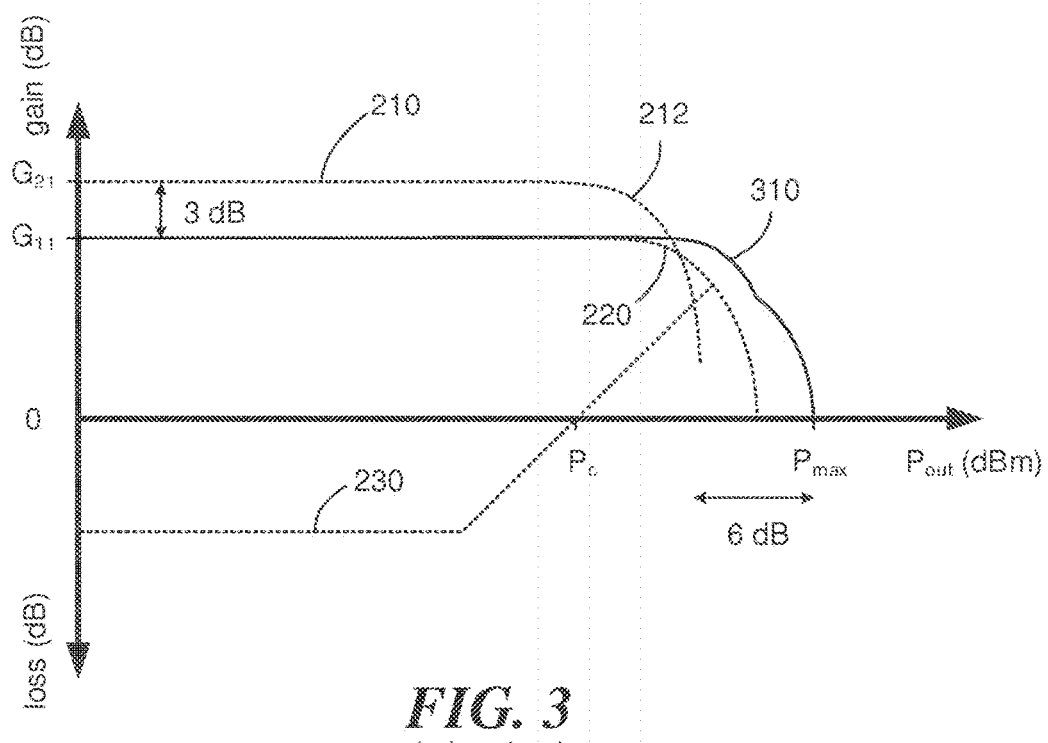
FIG. 3 illustrates gain characteristics as a function of output power for a Doherty amplifier.
Figure 4:
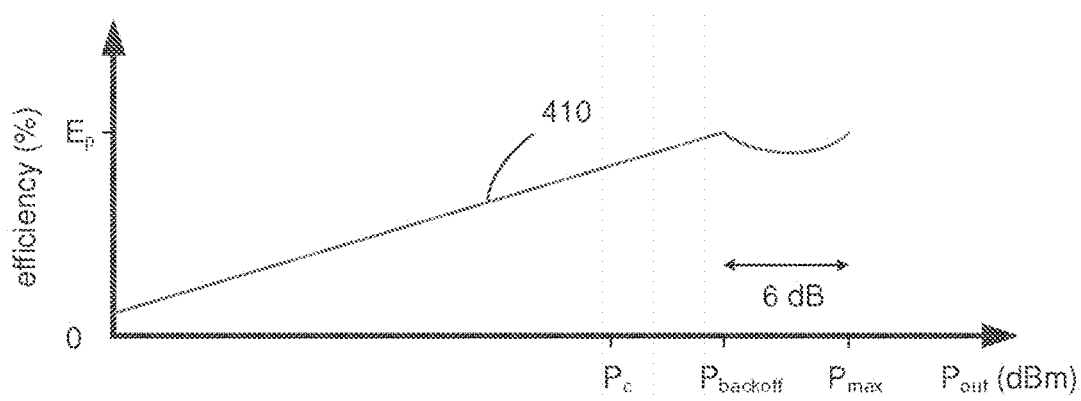
FIG. 4 illustrates efficiency of a Doherty amplifier as a function of output power.

Additional details of Doherty amplifier gain and efficiency dynamics are illustrated in FIG. 3 and FIG. 4. In FIG. 3, a first gain curve 210 (dotted line) depicts gain of a main amplifier 132 as a function of output power $P_{out}$ when the peaking amplifier 138 is idle (non-amplifying). The gain curve 210 corresponds to the 2:1 load condition. The peaking amplifier 138 is typically idle at low input signal power levels, e.g., input signal levels that will not begin saturating the main amplifier 132 or signal levels corresponding to about and more than 6 dB below a peak output power level $P_{max}$ of the Doherty amplifier. These low level signals can be handled by the main amplifier 132 only. At higher signal levels, the gain of the main amplifier 132 will begin to saturate and go into "compression," which begins at a power compression point $P_c$ and is indicated by the fall-off region 212 in FIG. 3. At this point, the main amplifier 132 begins to amplify non-linearly, and would otherwise distort the input RF signal. The power compression point for a main amplifier 132 will depend upon its design (e.g., the size of active areas in the amplifier's transistors), and could be any value from 1 Watt to 100 Watts for an amplifier used in a communication system. Smaller or larger values of the power compression point may occur in some embodiments.

For a Doherty amplifier, the peaking amplifier 138 begins to amplify the input RF signal and contribute to the Doherty amplifier's output at the power compression point $P_c$. An example gain curve 230 for the peaking amplifier 138 is also depicted in FIG. 3. The peaking amplifier 138 makes up for saturation of the main amplifier 132 at high powers until the peaking amplifier begins to saturate, go into compression, and fall off, as indicated in the drawing. Action of the peaking amplifier 138 can extend linear amplification by the Doherty amplifier over a range of high powers beyond the capability of the main amplifier 132 alone, until the peaking amplifier starts saturating.

FIG. 3 includes a second gain curve 220 for the main amplifier 132 when the peaking amplifier 138 is active (amplifying). The curve 220 corresponds to the 1:1 load condition. When the peaking amplifier 138 is active, it effectively adds load impedance to the main amplifier 132 (effectively reducing the gain of the main amplifier by about 3 dB) but also assists in amplifying high power levels (extending the Doherty's compression to higher powers). FIG. 3 also depicts a gain curve 310 (solid dark curve) as a function of output power for the Doherty amplifier. The Doherty gain curve 310 is a result of the combined actions of the main amplifier 132 and peaking amplifier 138 as described above.

An efficiency curve 410 for a Doherty amplifier is illustrated in FIG. 4. The efficiency of the Doherty rises to a peak efficiency $E_p$, that occurs approximately when the gain of the peaking amplifier 138 has reached its highest value. Ideally in a Doherty amplifier, the peak efficiency $E_p$ would occur at about 6 dB below the maximum output power $P_{max}$ (at a power denoted as $P_{backoff}$ in the graph), in a region referred to as "output power back-off" (OBO, sometimes denoted OPO). The efficiency falls below the peak value $E_p$ for output power levels below $P_{backoff}$ in a region where the peaking amplifier is transitioning from low gain levels (where the peaking amplifier primarily loads the main amplifier) to its maximum gain (refer to FIG. 3).

In reality, the peak efficiency for a Doherty does not occur at 6 dB OBO, because of several effects present in conventional Doherty amplifiers. A first effect relates to isolation of the peaking amplifier 138 in power back-off. Although the peaking amplifier is modeled above as having infinite impedance (open circuit) in back-off, in practical applications the impedance is finite at 6 dB OBO. Further, the impedance inverter 150 and/or output matching elements 142, 144 can exhibit losses which may not be insignificant. Additionally, the main amplifier 132 and peaking amplifier 138 typically have non-ideal I-V curves and/or knee voltages. All these effects can cause the peak efficiency to occur at a value that is less than 6 dB OBO (e.g., about 5 dB OBO or less), which in turn causes the Doherty amplifier's efficiency to be reduced further than shown in FIG. 4 in regions below about 6 dB OBO.

The inventor has recognized and appreciated that load modulation in a Doherty amplifier can adversely affect power handling and bandwidth capability of a Doherty amplifier. The inventor has also recognized and appreciated that conventional Doherty amplifiers exhibit a peak efficiency in a region between about 5 dB OBO and about 6 dB OBO. The inventor has further recognized and appreciated that currently-developed communication protocols can increase the peak-to-average power ratio (PAPR) in communication signals to 7 dB or more to handle large data rates with high spectral efficiency. As a result, to preserve amplifier linearity a Doherty amplifier may be operated in a corresponding region (7 dB OBO or more) for a large portion of its operating time, which is a region where the conventional Doherty amplifier's efficiency is reducing.

Figure 5:
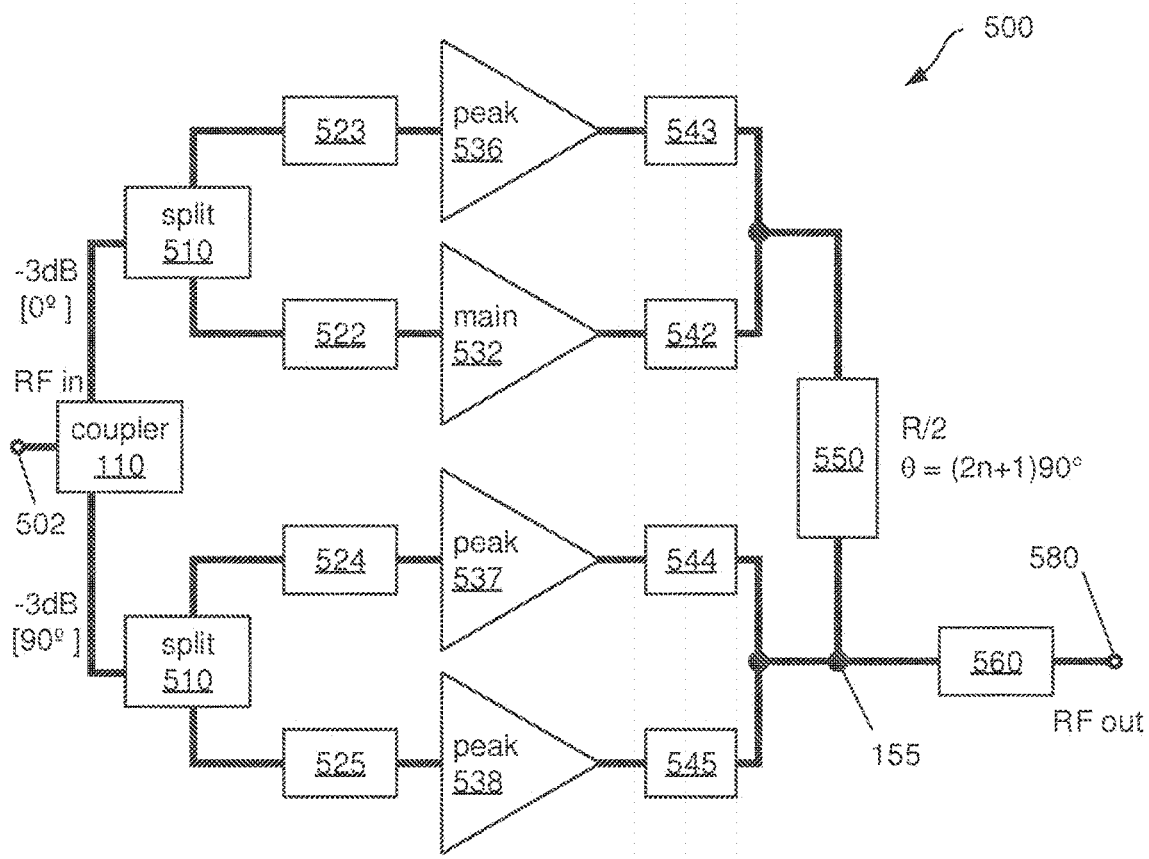
FIG. 5 depicts a no-load-modulation, multiclass power amplifier, according to some embodiments.

The inventor has conceived of a no-load-modulation, improved-efficiency, broadband multiclass power amplifier that can exhibit a peak efficiency at back-off power margins of 6 dB or more. The amplifier can be essentially free of load modulation effects such as that caused by "on" and "idle" states of the peaking amplifier in a Doherty amplifier. One example of a no-load-modulation, multiclass power amplifier 500 is depicted in FIG. 5.

A multiclass power amplifier 500 may comprise a plurality of amplifiers 532, 536, 537, 538 operating on portions of a received signal (e.g., a received RF signal) in more than two parallel circuit branches. The received signal at an input port 502 may be divided into the parallel circuit branches and provided to the plurality of amplifiers. Outputs from the amplifiers may be combined at a combining node 155 and subsequently provided to an output port 580 of the amplifier.

A first amplifier 532 of the plurality of amplifiers may be configured to operate as a main amplifier in a first amplifying class. For example, the first amplifying class may be class A, class B, or class AB. The remaining amplifiers 536, 537, 538 may be configured to operate as peaking amplifiers in a second class (e.g., class C). According to some embodiments, a first portion of the plurality of amplifiers 532, 536 may operate on portions of the received signal to be amplified, wherein the portions of the received signal have a first phase. A second portion of the plurality of amplifiers 537, 538 may operate on portions of the received signal that have a second phase different from the first phase. The second phase may be delayed between 80° and 100° with respect to the first phase. In some embodiments, the second phase may be delayed approximately 90°, or an odd integer multiple thereof, with respect to the first phase by a coupler 110. In such embodiments, a first combined signal from the first portion of the plurality of amplifiers 532, 536 may be provided to an impedance inverter 550 that delays the phase of the first combined signal with respect to a second combined signal from the second portion of the plurality of amplifiers 537, 538 by an approximately same amount (e.g., between 80° and 100° or approximately 90° so that signals combine in phase at the combining node 155.

A no-load modulation, multiclass power amplifier 500 may include one or more power splitters 510 that divide a received signal into two or more output signals of approximately equal power levels that are provided to two or more output ports. Outputs from the splitters 510 may be provided to the plurality of amplifiers 532, 536, 537, 538 as depicted in FIG. 5, for example.

In some implementations, the coupler 110 and splitter 510 functionality may be combined into a single multi-port device that includes an integrated network. The integrated network may comprise lumped (e.g., discrete) and/or distributed (e.g., microstrip waveguides) inductive and capacitive elements. Examples of lumped inductive elements include, but are not limited to, discrete inductors and bond wires. The multi-port device may include at least one input port and four output ports, for example. The four output ports may provide approximately equal portions of an input signal received at an input port of the device, although the phase of the signals from two output ports may be delayed by approximately 90° with respect to the phase of the signals from the other two output ports.

According to some implementations, input impedance-matching elements 522, 523, 524, 525 may be located before the inputs to the plurality of amplifiers 532, 536, 537, 538. An input impedance-matching element 524 may comprise lumped and/or distributed inductive and capacitive elements that are arranged to match an input impedance of its associated amplifier 537 to an impedance of an upstream transmission line or output impedance from a splitter 510, for example. In some implementations, output impedance-matching elements 542, 543, 544, 545 may be located after outputs from the plurality of amplifiers. An output impedance-matching element 544 may comprise lumped and/or distributed inductive and capacitive elements that are arranged to match an output impedance of its associated amplifier 537 to an impedance of a downstream transmission line or element, for example.

In some embodiments, the input impedance-matching elements 522, 523, 524, 525 and/or output impedance-matching elements 542, 543, 544, 545 may be omitted. For example, a single input impedance matching element (not shown) may be located after the input port 502 to match an input impedance of the coupler 110 or the above-described multi-port device to an impedance of an upstream transmission line or element. In such a case, the coupler 110 or multi-port device may be constructed to have output impedances that match input impedances of the plurality of amplifiers. Similarly, an output impedance-matching element 560 and impedance inverter 550 may be constructed to have an input impedances that match to output impedances of the plurality of amplifiers 532, 536, 537, 538. The output impedance-matching element 560 may have an output impedance that matches to an impedance of a load to be driven by the power amplifier 500.

Figure 6A:
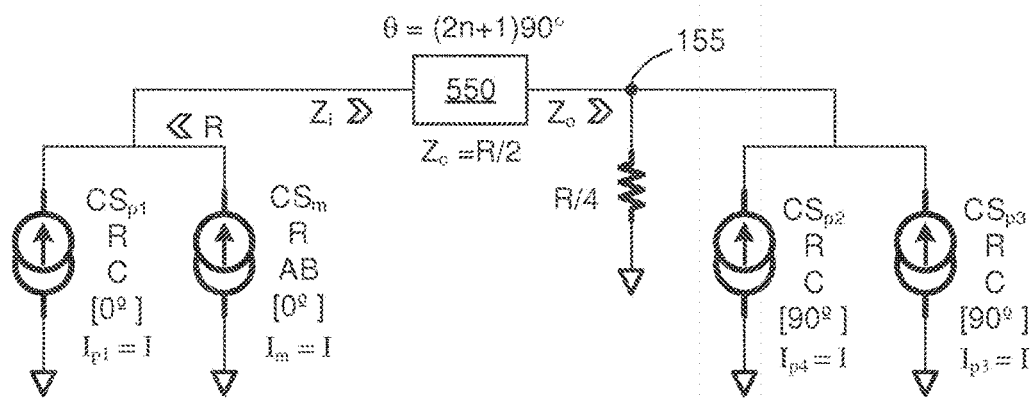
FIG. 6A depicts a first circuit model for a no-load-modulation, multiclass power amplifier when all amplifiers are fully amplifying, according to some embodiments.

A first circuit model 602 for a no-load modulation, multiclass power amplifier 500 is depicted in FIG. 6A. This simplified model can be used to represent the power amplifier 500 when all of the plurality of amplifiers 532, 536, 537, 538 are fully amplifying, each providing a peak output current of I and each having an internal resistance or output impedance of R. Two amplifiers may be modeled as two current sources $CS_{p1}$, $CS_m$ connected in parallel and providing amplified signals at a first phase (e.g., approximately 0°. The current source $CS_m$ may correspond to the main amplifier 532 of the no-load modulation, power amplifier 500. The current source $CS_{p1}$ may correspond to the first peaking amplifier 536. The amplified signals from the two current sources $CS_{p1}$, $CS_m$ may be combined and provided to an impedance inverter 550. According to some embodiments, the impedance inverter 550 may add a phase delay of an odd multiple of 90°, or approximately this value, to the combined signal and provide a first output signal to a combining node 155. Two additional amplifiers (second and third peaking amplifiers 537, 538) may be modeled as two current sources $CS_{p1}$, $CS_{p3}$ connected in parallel and providing amplified signals at a second phase (e.g., 90° or approximately this value with respect to the first phase) to the combining node 155. For the four-amplifier embodiment depicted, a characteristic impedance $Z_c$ of the impedance inverter may be approximately R/2. Additionally, an impedance of a load connected to the combining node or an impedance seen at the combining node looking toward the output of the amplifier may be approximately R/4. In some cases, the impedance R/4 may be an input impedance to an output impedance-matching element 560.

Analysis of the circuit model in FIG. 6A, for the impedance values and matching currents I shown, reveals that an impedance seen by the main amplifier 532 (modeled as current source $CS_m$ in FIG. 6A) is R (indicated by the chevron symbol in the drawing). This impedance value can be found in a multi-step analysis. First, an impedance $Z_o$ seen at an output of the impedance inverter 550 looking toward the combining node 155 is calculated. The value found for that impedance is then rotated back through the impedance inverter 550 according to the inverter's characteristic impedance to give an impedance $Z_i$ seen at the input of the impedance inverter 550. Finally, the impedance seen by the main current source $CS_m$, which is operating in parallel with one of the peaking current sources $CS_{p1}$, can be calculated based on the input impedance $Z_i$ at the impedance inverter 550. For the load impedance and characteristic impedance shown in FIG. 6A, the impedance seen by the main current source $CS_m$ when all amplifiers (current sources) are fully amplifying is found to be R.

Figure 6B:
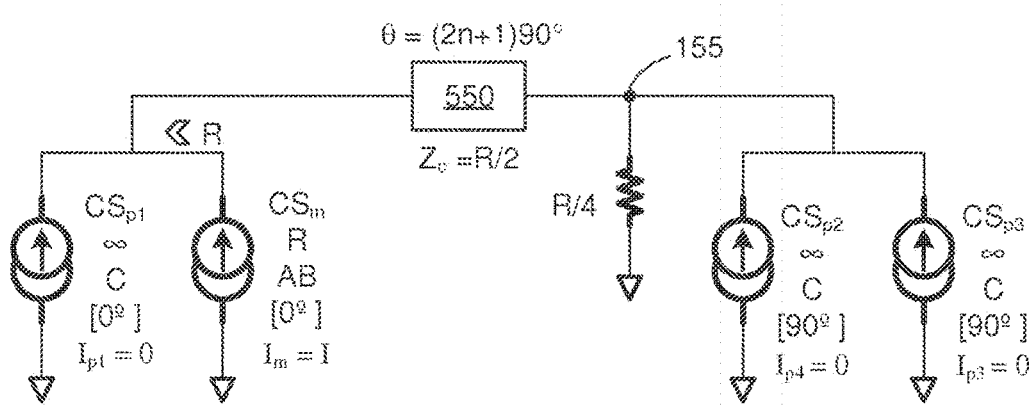
FIG. 6B depicts a second circuit model for a no-load-modulation, multiclass power amplifier when only a main amplifier is active, according to some embodiments.

A circuit model for the four-amplifier embodiment in which only the main amplifier is active is shown in FIG. 6B. In an ideal model, the impedances of the amplifiers which are inactive (non-amplifying) increases to an infinite or near infinite value, as indicated in the drawing. In this case, only the the main amplifier 532 (main current source $CS_m$) provides power to the combining node 155, so that the impedance $Z_o$ seen at the output of the impedance inverter is R/4. Rotating this impedance back through the inverter 550, which has a characteristic impedance $Z_c$=R/2, gives an impedance $Z_i$ of R at the input to the inverter 550. This input impedance is the impedance seen by the main current source $CS_m$ when the peaking current source $CS_{p1}$ is idle (essentially presenting an open circuit).

Based on the analyses for the fully-on state (FIG. 6A) and the fully backed-off state (FIG. 6B), the main current source $CS_m$ (representative of the main amplifier 532) sees a same impedance when the peaking current sources $CS_{p1}$, $CS_{p2}$, $CS_{p3}$ are fully active and when they are idle. A load-modulation effect common to conventional Doherty amplifiers is not present for the no-load modulation, power amplifier 500 of the present embodiment.

For the analyses of FIG. 6A and FIG. 6B, the output impedances of the amplifiers (current sources) is taken as R. In practice, the amplifiers may have an output impedance of a value other than R and impedance-matching elements 542, 543, 544, 545 may be used to transform the output impedances to a desired value. In other embodiments, the output impedances of the amplifiers may have a value other than R and the impedance inverter 550 may have a characteristic impedance other than R/2, such that it rotates an impedance value at its output to an impedance value that matches an output impedance of the main amplifier 532, for example.

Figure 7:
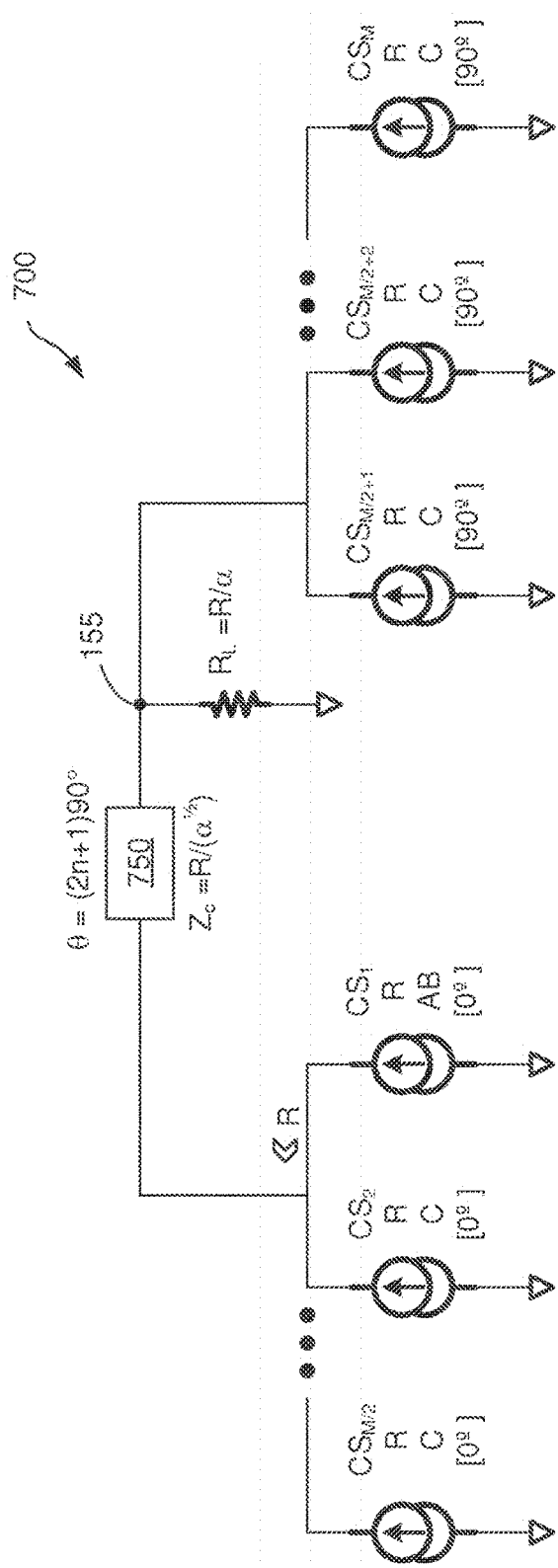
FIG. 7 depicts a circuit model for an M-way no-load-modulation, multiclass power amplifier, according to some embodiments.

FIG. 7 depicts a simplified circuit model 700 for an M-way no-load modulation, multiclass power amplifier in which more than four amplifiers may be arranged in parallel. For the embodiment shown, there are an even number (M) of amplifiers (represented as current sources in the circuit model) arranged in parallel. A first half (M/2) of the amplifiers are arranged on a first side of the impedance inverter 750. Of these, one amplifier ($CS_1$) may be configured to operate as a main amplifier in class AB mode, for example. The remaining amplifiers ($CS_2$ . . . $CS_{M/2}$) on the first side of the impedance inverter 750 may be configured to operate as peaking amplifiers (in class C mode, for example). All of the amplifiers on the first side of the impedance inverter may be configured to operate on equal portions of a received signal having a first phase (0°, for example).

A second half of the amplifiers (modeled as current sources $CS_{M/2+1}$ . . . $CS_M$) are arranged on a second side of the impedance inverter 750. All of these amplifiers may be configured to operate as peaking amplifiers in a same amplifier class as the peaking amplifiers on the first side of the impedance inverter. All of the amplifiers on the second side of the impedance inverter 750 may receive equal portions of the received signal that are phase delayed (by approximately 90°, for example) with respect to the phase of signals provided to the first half of the amplifiers.

The signals from the first half of the amplifiers may be combined and provided to an impedance inverter 750 having a characteristic impedance value of $R/(\alpha^{1/2})$. A signal from the impedance inverter 750 may be provided to a combining node 155. Signals from the second half of amplifiers may be combined and provided to the combining node. The output impedance values for all the amplifiers may be R in some embodiments, though in other embodiments the output impedances may be a value other than R and impedance-matching elements may be connected to the outputs of the amplifiers.

Following the analytic process described above in connection with FIG. 6A and FIG. 6B, it can be shown that the main amplifier ($CS_1$) sees a load impedance $Z_{off}$ of approximately R when the multiclass power amplifier is in a fully back-off state (all peaking amplifiers idle). The analysis also shows that when the power amplifier is fully on, the main amplifier sees a load impedance $Z_{on}$ that is approximately NR/4, where R is an even number greater than 2. When N=4 amplifiers, there is essentially no load modulation in agreement with the 4-way power amplifier 500 of FIG. 5. When N=6 amplifiers, there may be some load modulation, but the load modulation is less than the amount of modulation that occurs in a conventional Doherty amplifier. When N=8 amplifiers, the load modulation is about equivalent to the load modulation that occurs in a conventional Doherty amplifier.

A reduction in load modulation of the main amplifier can improve the performance of the multiclass power amplifier in several ways. For example, a reduction in load modulation can improve the bandwidth performance of the power amplifier, since the main amplifier sees a better-matched load whether the power amplifier is in a fully-on state or fully backed-off state. Additionally, a reduction in load modulation can reduce the amounts of amplitude-modulation-to-amplitude-modulation (AMAM) distortion and amplitude-modulation-to-phase-modulation (AMPM) distortion that occurs in conventional Doherty amplifiers.

In some embodiments, more than four amplifiers (N>4) may be used in a multiclass power amplifier to improve the amplifier's efficiency. The location of the peak efficiency in back-off, denoted as $P_{backoff}$ in FIG. 3, can be represented approximately by the following equation for the power amplifier configuration depicted in FIG. 7.

$$P_{backoff} = P_{max} - 10 \log N \qquad \text{EQ. (1)}$$

In this expresseion, N is the total number of amplifiers in parallel circuit branches of the multiclass power amplifier. For 4 amplifiers, $P_{backoff}$ occurs at about 6 dB below the amplifier's maximum power output. For 6 amplifiers, $P_{backoff}$ occurs at about 7.8 dB below the amplifier's maximum power output. For 8 amplifiers, $P_{backoff}$ occurs at about 9 dB below the amplifier's maximum power output. Multiclass power amplifier embodiments that include 4, 6, or 8 amplifiers operating in parallel may be better suited then conventional Doherty amplifiers for communication systems or applications that have peak-to-average-power ratios (PAPR) of 7 dB or more.

Figure 8:
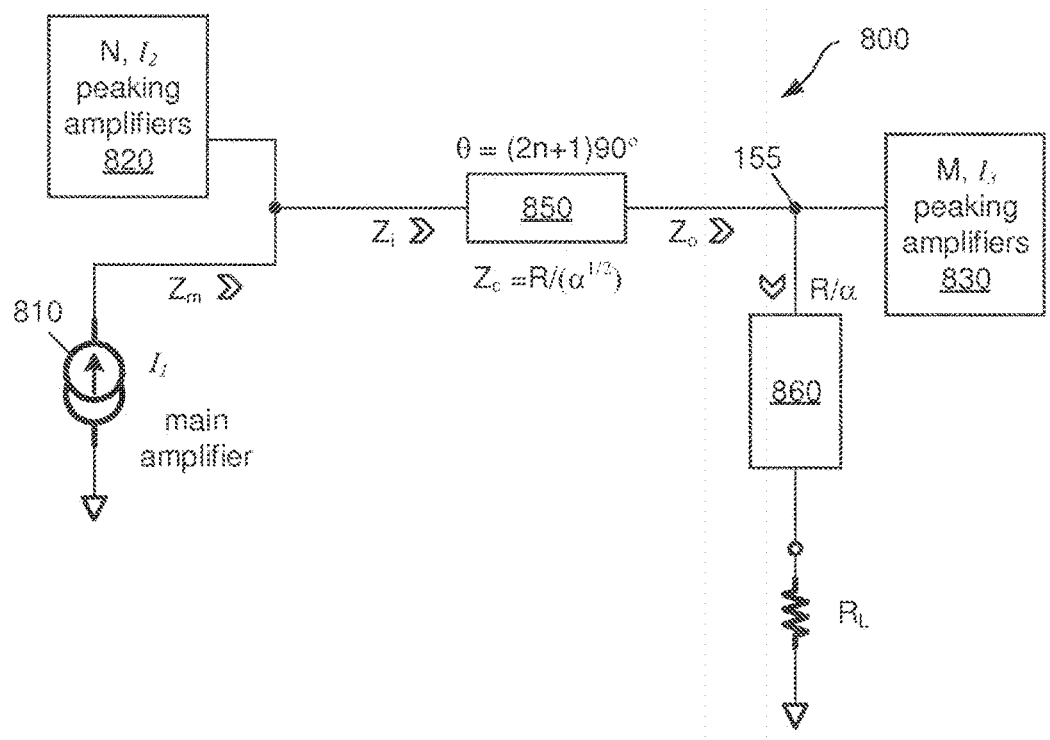
FIG. 8 depicts a circuit model for an (N+M+1)-way no-load-modulation, multiclass power amplifier, according to some embodiments.

Additional embodiments of a multi-way, multiclass, no-load-modulation power amplifier 800 are depicted schematically in FIG. 8. For these embodiments, there may be an even number or odd number of amplifiers (greater than 2) used in the power amplifier 800. In these embodiments, the amplifiers may provide different amounts of output power or current, so that the main amplifier 810 does not see load modulation, irrespective of the number and arrangement of amplifiers.

The power amplifier 800 may comprise a main amplifier 810 connected on a first side of an impedance inverter 850.

There may also be one or more (N>1) first peaking amplifier (s) (denoted generally with 820) connected in parallel with the main amplifier on the same side of the impedance inverter 850. There may be one or more (M>1) second peaking amplifier(s) 830 located on a second side of the impedance inverter 850. Outputs from the main amplifier 810 and first peaking amplifier(s) 820 may be combined and provided to the impedance inverter 850. Outputs from the impedance inverter 850 and second peaking amplifier(s) 830 may be combined at a combining node and provided to an output port 880 of the power amplifier 800, which may connect to a load (shown as having an impedance of R/α). In some implementations, the power amplifier 800 may be assembled on a circuit board or MMIC.

The main amplifier 810 may be capable of providing a first amount of maximum power or current $I_1$ when fully amplifying a signal to a maximum allowed level. The main amplifier may be configured to operate in a first amplification class (e.g., class AB). In some embodiments, the main amplifier 810 may comprise one or more semiconductor transistors formed on a semiconductor die. As just one example, the main amplifier 810 may comprise an array of high-electron-mobility transistors (HEMTs) that are formed from gallium-nitride material and located on a first die. Other materials and types of transistors may be used in other embodiments.

The first peaking amplifier(s) 820 may each be capable of providing a second amount of maximum power or current $I_2$ when fully amplifying a signal to a maximum allowed level. The first peaking amplifier(s) may be configured to operate in a second amplification class (e.g., class C). In some embodiments, the first peaking amplifier(s) 820 may comprise one or more semiconductor transistors formed on a semiconductor die. As just one example, the first peaking amplifier(s) 820 may comprise an array of high-electron-mobility transistors (HEMTs) that are formed from gallium-nitride material and located on a second die. Other materials and types of transistors may be used in other embodiments.

The second peaking amplifier(s) 830 may each be capable of providing a third amount of maximum power or current $I_3$ when fully amplifying a signal to a maximum allowed level. The second peaking amplifier(s) 830 may be configured to operate in the second amplification class (e.g., class C). In some embodiments, the second peaking amplifier(s) 830 may comprise one or more semiconductor transistors formed on a semiconductor die. As just one example, the second peaking amplifier(s) 830 may comprise an array of high-electron-mobility transistors (HEMTs) that are formed from gallium-nitride material and located on a second die. Other materials and types of transistors may be used in other embodiments.

In some implementations, the output impedances of the main and peaking amplifiers may be R. In other cases, the output impedance values may differ from R, and impedance-matching elements (not shown in FIG. 8) may be connected to the outputs of one or more amplifiers to match the output impedance(s) of the amplifier(s) to downstream impedance values. In other cases, the output impedance values may differ from R, and the outputs from the impedance inverter and second peaking amplifiers may be combined and provided to an impedance-matching element 860 that transforms the impedance to match, or approximately match, an impedance of the load.

Although FIG. 8 does not show how a received signal to be amplified is split and provided to the different amplifiers, the received signal may be divided and provided to the amplifiers as depicted in FIG. 5, e.g., using a combination of a coupler 110 and splitters 510. In embodiments, the received signal to be amplified may be divided such that each amplifier receives approximately a same input signal level. In some implementations, signals provided to the second peaking amplifier(s) 830 may have a common phase delay (e.g., an odd integer multiple of 90° or approximately an odd integer multiple of 90° with respect to the common phase of signals provided to the main amplifier 810 and first peaking amplifier(s) 820. The impedance inverter 850 may provide a compensating phase delay, such that signals combine at the combining node 155 in phase or approximately in phase.

The multiclass, no-load-modulation power amplifier 800 depicted in FIG. 8 may be analyzed in the same way that the amplifiers of FIG. 5 and FIG. 7 are analyzed. In the fully backed-off state, the peaking amplifiers 820, 830 are idle and are modeled as presenting open circuits (infinite impedance). From the model depicted in FIG. 8, it can readily be shown that the main amplifier 810 sees a load impedance $Z_{m,off}$ of R at its output when the power amplifier is in a fully backed-off state.

When the power amplifier 800 is fully on, then all the peaking amplifiers 820, 830 provide their maximum output $I_2$, $I_3$. Under these conditions, the impedance $Z_o$ seen at the output of the impedance inverter 850 is first found. This value is rotated back through the impedance inverter 850 based on its characteristic impedance to an input impedance value $Z_i$. The input impedance value $Z_i$ is then used to determine the impedance $Z_{m,on}$ seen by the main amplifier 810 in the fully-on state. Without being bound to a particular theory, the impedance $Z_{m,on}$ can be represented by the following expression, according to some embodiments.

$$Z_{m,on} = \left[\frac{\left(1 + \frac{NI_2}{I_1}\right)^2}{(I_1 + NI_2 + MI_3)}\right] R \qquad \text{EQ. (2)}$$

Setting the bracketed quotient equal to unity, for no load modulation, gives the following expression.

$$I_3 = \frac{NI_2}{M}\left(1 + \frac{NI_2}{I_1}\right) \qquad \text{EQ. (3)}$$

A power amplifier designer may use EQ. 3 to determine and set a maximum current capability of each amplifier for a no-load-modulation condition once the number and arrangement of amplifiers (M and N) has been determined. For example, if N=1, M=2, and $I_2=I_1$, then $I_3=I_1$, which represents the four-amplifier embodiment depicted in FIG. 5 and analyzed in connection with FIG. 6A and FIG. 6B. In cases where there are an even number of amplifiers with one-half of the amplifiers located on one side of the impedance inverter and the remaining half located on the other side of the impedance inverter, then M=N+1 and EQ. 3 suggests that an asymmetric configuration of the no-load-modulation power amplifier may be needed to prevent load modulation. An asymmetric configuration is one in which the total amount of current (or power) provided by amplifiers on one side of the impedance inverter 850 does not equal the total amount of current (or power) provided by amplifiers on the other side of the impedance inverter 850 when the no-load-modulation power amplifier is in a fully-on state. EQ. 3 also allows for an odd number of amplifiers to be used with no load modulation.

According to some embodiments, the location of the peak efficiency at back-off ($P_{backoff}$) for the power amplifier 800 depicted in FIG. 8 may be determined from the following expression.

$$P_{backoff} = P_{max} - 10 \log(N+M+1) \qquad \text{EQ. (4)}$$

The power amplifier 800 embodiments depicted in FIG. 8 may provide more flexibility in determining the location of the peak efficiency at back-off in addition to providing no load modulation of the main amplifier 810. Because the main amplifier 810 does not experience load modulation, the bandwidth of the power amplifier 800 may be improved compared to a Doherty amplifier or other amplifier embodiments in which the main amplifier experiences load modulation. Because the location of $P_{backoff}$ can be pushed to deeper regions of OBO by adding more amplifiers, the power amplifier 800 can also provide higher operating efficiency at higher PAPRs.

Methods of operating a no-load-modulation power amplifier of the present embodiments are also contemplated. A method of operating a no-load-modulation power amplifier of the present embodiments may include a combination of acts such as, but not limited to, receiving, at a coupler, a signal (e.g., an RF signal which may be modulated to include data for transmitting), and dividing the signal with the coupler into a first signal and a second signal. A method may further include splitting the first signal into a first subset of signals and providing one of the first subset of signals to a main amplifier and the remainder of the first subset of signals to N first peaking amplifiers. A method may further include splitting the second signal into a second subset of signals and providing the second subset of signals to M second peaking amplifiers. In some cases, a method may include delaying the phase of the second signal with respect to the first signal. A method may further include combining outputs from the main amplifier and the first peaking amplifiers into a first combined output and providing the first combined output to an impedance inverter. A method may also include combining outputs from the second peaking amplifiers into a second combined output and providing the second combined output and an output from the impedance inverter to a combining node to produce a combined output signal that may be provided to an output port of the power amplifier. In some implementations, the combined output signal may be applied to a load or other apparatus. For example, the combined output signal may be applied to an antenna to transmit a signal wirelessly. The impedance of the load and characteristic impedance of the impedance inverter may have the relative values described for FIG. 8, for example.

Additional Features for No-Load-Modulation Power Amplifiers

This section describes features that may be included in a no-load-modulation power amplifier of any of the above-described embodiments.

In some embodiments of power amplifiers depicted in FIG. 5, FIG. 7, and FIG. 8 where the main amplifier and peaking amplifiers are configured to have a same maximum power or maximum current capability, the main amplifier and peaking amplifiers may be of a same design. The term "same design" means that the amplifiers are nearly identical or identical for all intents and purposes. For example, the amplifiers may be formed as integrated power transistors (such as the HEMT devices described above) using a same micro fabrication process, though there may be slight variations in structure due to the nature of the microfabrication process. Although the main amplifier and peaking amplifiers may be of a same design, they may be biased differently to operate in different amplification classes. Where the main amplifier and peaking amplifiers are configured to have different maximum current capabilities, the main amplifier and peaking amplifiers may comprise semiconductor amplifiers of different designs.

In some embodiments, the main amplifier and peaking amplifiers may comprise gallium-nitride transistors. In other embodiments, other semiconductor materials may be used, such as gallium-arsenide or silicon-germanium, and the invention is not limited to only these semiconductors. An example of a semiconductor amplifier that may be used in whole or in part for the main amplifier and/or peaking amplifiers in a power amplifier of the present embodiments is described in U.S. patent application Ser. No. 14/878,952 filed Oct. 8, 2015, titled "Tuned Semiconductor Amplifier," which application is incorporated herein by reference in its entirety, however the invention is not limited to only this type of amplifier. In some implementations, the gain values of a main amplifier and a peaking amplifier may be between 16 dB and 30 dB, or approximately between these gain values. In some cases, the gain values of the main and peaking amplifiers in a no-load-modulation power amplifier that is operating in a fully-on state may be the same to within 3 dB.

As used herein, the phrase "gallium nitride" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_xP_yN_{(1-x-y)}$), aluminum indium gallium arsenide phosporide nitride ($Al_xIn_yGa_{(1-x-y)}As_aPb_b N_{(1-a-b)}$), amongst others. In some cases, the transistors may be formed from other semiconductor materials such as gallium arsenide, silicon carbide, silicon germanium, silicon, indium phosphide, etc. and the invention is not limited to gallium-nitride-based amplifiers.

Because a no-load-modulation power amplifier of the present embodiments includes more than two semiconductor amplifiers, the power-handling capability of each semiconductor amplifier is reduced compared to the power-handling capability of a conventional Doherty amplifier in which only two semiconductor amplifiers are used (for a fixed power specification). For example, in a case where a power amplifier 500 of the present embodiments includes four amplifiers that are configured to handle a same amount of power at maximum output, each amplifier only needs to provide one-half the amount of power compared to a two-amplifier Doherty. Additionally, since each amplifier has about one-half the power-handling requirement the amplifiers can be made smaller and exhibit less drain-to-source parasitic capacitance. The comparative reduction in parasitic capacitance can allow each amplifier to operate at higher speeds and support larger RF fractional bandwidths and video bandwidths.

A no-load-modulation power amplifier of the present embodiments may be implemented in a variety of packages. According to some embodiments, a no-load-modulation power amplifier may be assembled on a printed-circuit board or application board using discrete components. In some embodiments, a no-load-modulation power amplifier may be fabricated as part of a monolithic microwave integrated circuit (MMIC). For example, the main and peaking amplifiers may each be fabricated as one or more integrated, semiconductor transistors that are mounted on a PCB or MMIC. The coupler, delay elements, and impedance-matching elements may be formed as discrete or integrated components, or a combination thereof. Connections between components may be made using wire bonds, microstrip transmission lines, or a combination thereof. Discrete, lumped, or integrated components (e.g., capacitors, diodes, inductors, etc.) may be connected in a power amplifier circuit.

A no-load-modulation power amplifier of the present embodiments may be incorporated into a cell phone or base station amplification system and used for amplifying wireless communication signals, according to some embodiments. A no-load-modulation power amplifier of the present embodiments may be incorporated into any device that has wireless access capability including, but not limited to, computers, tablets, smart phones, smart watches, vehicles, smart appliances, etc. Advantages of a no-load-modulation power amplifier of the present embodiments for portable devices include its higher bandwidth and higher gain capabilities compared to conventional Doherty amplifiers. The increased efficiency can contribute to prolonged battery life in a portable device and better accommodate signals with higher PAPRs. A broader bandwidth can cause less signal distortion compared to a conventional Doherty amplifier and accommodate higher data rates.

Referring again to FIG. 5, the inventor has recognized and appreciated that removing the impedance-matching elements 542, 543, 544, 545 before the impedance inverter 550 can be beneficial. In such cases, the signals from the main and peaking amplifiers may be combined first and an impedance-matching element may be added after the combining node to transform an impedance after the combining node to match, or approximately match, the load impedance. The inventor has found from simulations that the impedance-matching element before and after the amplifiers may add electrical path length that cannot be correctly compensated for by an impedance inverter 550 that provides only a 90° delay. Accordingly, the delay at the impedance inverter may be required to be an odd integer multiple of 90° greater than 1. Simulations show that such an increase in the delay at the impedance inverter can undesirable narrow the RF fractional bandwidth of the power amplifier. By removing the impedance-matching elements 542, 543, 544, 545, the delay at the impedance inverter may be 90° or approximately 90°, which improves the RF fractional bandwidth and video bandwidth performance of the power amplifier.

In some implementations, the impedance inverter of a no-load-modulation power amplifier of the present embodiments may be implemented in whole or in part as a conductive strip line (e.g., a microstrip transmission line) that has a length L and width W. In some implementations, there may be bond wires that connect drain pads of the main and peaking amplifiers to the strip line. The length L of the conductive strip line may be between approximately 2 millimeters and approximately 6 millimeters, according to some embodiments, and may be selected to provide a desired inductance for the strip line. The width of the conductive strip line may be between approximately 100 microns and approximately 1000 microns, according to some embodiments, and may be selected to provide a desired inductance for the strip line. By selecting the length and width of the strip line, the distributed inductance of the strip line 810 may be tuned to a desired value. According to some embodiments, a total of the distributed inductance of the strip line may be between approximately 250 picoHenries and approximately 1.5 nanoHenries.

In some implementations, the conductive strip line is formed over a ground conductor or ground plane and separated from the ground conductor or ground plane by a dielectric material (not shown). In other embodiments, the conductive strip line may not be formed over or adjacent to a ground plane. Instead, a ground plane may be removed from an area of a PCB at which the conductive strip line is patterned. The conductive strip line, when implemented in the impedance inverter for RF signals, may comprise an integrated, distributed impedance element which is essentially entirely inductive. In some implementations, the strip line may include some parasitic capacitance and resistance. An example substrate on which a conductive strip line is formed may comprise a printed circuit board in some embodiments, a high-frequency laminate capable of carrying signals at GHz frequencies in some embodiments, a ceramic, or a semiconductor. An example of a high-frequency laminate is laminate model RO4003® available from Rogers Corporation of Chandler, Ariz.

In some embodiments, an impedance inverter of a no-load modulation power amplifier of the present embodiments may not include a microstrip line. Instead, an impedance inverter may be embodied as an RF network comprising bond wires and capacitive elements. The bond wires may be comprise gold or any other suitable conductor and may have a diameter between 20 microns and 80 microns. The spacing between the bond wires that connect to drain pads on a main amplifier or peaking amplifier may be between approximately 100 microns and approximately 800 microns, according to some embodiments. The bond wires may comprise lumped inductive elements of the impedance inverter. Such bond wires are recognized in the field of RF electronics as "lumped inductors" having an inductance that is determined primarily by a length and diameter of the bond wire.

In some implementations, a combining node 155 of a no-load modulation power amplifier of the present embodiments may be located at one or more drain pads of the peaking amplifier(s) that are located on a same side of the impedance inverter as the load.

According to some embodiments, a value of load impedance R seen by the main amplifier in a no-load modulation power amplifier of the present embodiments may be set to a value that is based upon the design of the main amplifier. For example, a main amplifier may be rated at a maximum drain-to-source current $I_{max}$ for an applied operating voltage $V_{ds}$ that is applied between the amplifier's drain and source. The resistance R at which maximum power may be transferred from the main amplifier may be determined approximately from the following relation.

$$R \approx 2(V_{ds} - V_k)/I_{max} \qquad \text{(EQ. 5)}$$

where $V_k$ is the knee voltage for the amplifier.

In view of the foregoing, various embodiments of no-load-modulation power amplifier and methods of operating a no-load-modulation power amplifier may be implemented as follows.

(1) A multiclass power amplifier embodiment comprising: a first amplifier in a first circuit branch arranged to operate in a first amplifier class; a second amplifier in a second circuit branch arranged to operate in a second amplifier class that is different from the first amplifier; an impedance inverter configured to receive a combined output from the first amplifier and the second amplifier; a third amplifier in a third circuit branch arranged to operate in the second amplifier class; and a combining node configured to receive an output from the impedance inverter and the third amplifier and provide a combined output to an output port of the multiclass power amplifier for driving a load.

(2) The multiclass power amplifier of embodiment (1), wherein the first amplifier sees a same impedance at its output when the second amplifier and the third amplifier are idle and when the second amplifier and the third amplifier are fully amplifying.

(3) The multiclass power amplifier of embodiments (1) or (2), wherein the first amplifier operates in class AB mode and the second amplifier and the third amplifier operate in class C mode.

(4) The multiclass power amplifier of any one of embodiments (1) through (3), wherein the load has an impedance of approximately $R/\alpha$ and a characteristic impedance of the impedance inverter is approximately $R/(\alpha^{1/2})$.

(5) The multiclass power amplifier of any one of embodiments (1) through (4), wherein the value of a is 4.

(6) The multiclass power amplifier of any one of embodiments (1) through (5), wherein the impedance inverter is configured to provide a phase delay at a carrier-wave frequency that is approximately equal to an odd multiple of 90 degrees.

(7) The multiclass power amplifier of any one of embodiments (1) through (6), wherein the impedance inverter comprises a microstrip transmission line.

(8) The multiclass power amplifier of any one of embodiments (1) through (7), wherein R is an impedance seen by the first amplifier and is approximately equal to an impedance value at which a maximum amount of power is transferred from the first amplifier.

(9) The multiclass power amplifier of any one of embodiments (1) through (8), wherein a peak efficiency for the multiclass power amplifier occurs between 6 dB and 12 dB output power back-off.

(10) The multiclass power amplifier of any one of embodiments (1) through (9), further comprising an impedance-matching element connected between the combining node and an output of the multiclass power amplifier.

(11) The multiclass power amplifier of any one of embodiments (1) through (10), further comprising a fourth amplifier arranged to operate in the second amplifier class having an output that is coupled to the combining node, wherein, when fully amplifying, average power levels of the second amplifier, the third amplifier, and the fourth amplifier are approximately equal to an average power level of the first amplifier.

(12) The multiclass power amplifier of any one of embodiments (1) through (11), further comprising: a first impedance-matching element connected to an input of the first amplifier; a second impedance-matching element connected to an input of the second amplifier; and a third impedance-matching element connected to an input of the third amplifier.

(13) The multiclass power amplifier of any one of embodiments (1) through (12) incorporated in a wireless communication apparatus.

Any of the amplifier embodiments (1) through (13) may be used with any of the following method embodiments (14) through (22).

(14) A method of operating a multiclass power amplifier, the method comprising: dividing a signal to be amplified into a first signal provided to a first circuit branch, a second signal provided to a second circuit branch, and a third signal provided to a third signal branch; amplifying, in the first circuit branch, the first signal with a first amplifier operated in a first amplifier class; amplifying, in the second circuit branch, the second signal with a second amplifier operated in a second amplifier class that is different from the first amplifier class; amplifying, in the third circuit branch, the third signal with a third amplifier operated in the second amplifier class; combining outputs from the first amplifier and the second amplifier and providing the combined outputs to an impedance inverter; combining, at a combining node, an output from the impedance inverter and an output from the third amplifier; and providing an output from the combining node to an output port of the multiclass power amplifier.

(15) The method of embodiment (14), further comprising presenting approximately a same impedance to the first amplifier irrespective of whether the second amplifier and third amplifier are fully amplifying or are idle.

(16) The method of embodiment (14) or (15), further comprising exhibiting a peak efficiency for the power amplifier that occurs between 6 dB and 12 dB output power back-off.

(17) The method of any one of embodiments (14) through (16), further comprising delaying, by the impedance inverter, a phase of a carrier wave passing through the impedance inverter by a value that is approximately equal to an odd multiple of 90 degrees.

(18) The method of any one of embodiments (14) through (17), further comprising transforming, with an impedance-matching element, an impedance between the combining node and an output of the power amplifier.

(19) The method of any one of embodiments (14) through (18), wherein amplifying, in the first circuit branch, the first signal comprises operating the first amplifier in class AB mode.

(20) The method of any one of embodiments (14) through (19), wherein amplifying, in the second circuit branch, the second signal comprises operating the second amplifier in class C mode.

(21) The method of any one of embodiments (14) through (20), further comprising amplifying, with the power amplifier, communication signals in a cell phone base station.

(22) The method of any one of embodiments (14) through (21), further comprising amplifying, with the power amplifier, a communication signal for a cell phone or wireless communication device.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A multiclass power amplifier comprising:
a main amplifier in a first circuit branch arranged to operate in a first amplifier class;
at least one first peaking amplifier in a second circuit branch arranged to operate in a second amplifier class that is different from the first amplifier class, the second circuit branch being in parallel with the first circuit branch;
an impedance inverter configured to receive a combined output from the main amplifier and the at least one first peaking amplifier;
a plurality of second peaking amplifiers arranged to operate in the second amplifier class; and
a combining node configured to receive an output from the impedance inverter and a combined output from the plurality of second peaking amplifiers and provide a combined output to an output port of the multiclass power amplifier for driving a load.

2. The multiclass power amplifier of claim 1, wherein the main amplifier sees a same impedance at its output when the at least one first peaking amplifier and the plurality of second peaking amplifiers are idle and when the at least one first peaking amplifier and the plurality of second peaking amplifiers are fully amplifying.

3. The multiclass power amplifier of claim 1, wherein the main amplifier operates in class AB mode and the at least one first peaking amplifier and the plurality of second peaking amplifiers operate in class C mode.

4. The multiclass power amplifier of claim 1, wherein the load has an impedance of approximately R/a and a characteristic impedance of the impedance inverter is approximately $R/(\alpha^{1/2})$.

5. The multiclass power amplifier of claim 4, wherein the value of $\alpha$ is 4.

6. The multiclass power amplifier of claim 1, wherein the impedance inverter is configured to provide a phase delay at a carrier-wave frequency that is approximately equal to an odd multiple of 90 degrees.

7. The multiclass power amplifier of claim 1, wherein the impedance inverter comprises a microstrip transmission line.

8. The multiclass power amplifier of claim 4, wherein R is an impedance seen by the main amplifier and is approximately equal to an impedance value at which a maximum amount of power is transferred from the main amplifier.

9. The multiclass power amplifier of claim 1, wherein a peak efficiency for the multiclass power amplifier occurs between 6 dB and 12 dB output power back-off.

10. The multiclass power amplifier of claim 1, further comprising an impedance-matching element connected between the combining node and an output of the multiclass power amplifier.

11. The multiclass power amplifier of claim 1, wherein, when fully amplifying, average power levels of the at least one first peaking amplifier and plurality of second peaking amplifiers are approximately equal to an average power level of the main amplifier.

12. The multiclass power amplifier of claim 1, further comprising:
a first impedance-matching element connected to an input of the main amplifier; and
a second impedance-matching element connected to an input of the at least one first peaking amplifier.

13. The multiclass power amplifier of claim 1, incorporated in a wireless communication apparatus.

14. A method of operating a multiclass power amplifier, the method comprising:
dividing a signal to be amplified into a first signal provided to a first circuit branch, a second signal provided to a second circuit branch, and a third signal provided to a third circuit branch;
amplifying, in the first circuit branch, the first signal with a main amplifier operated in a first amplifier class;
amplifying, in the second circuit branch, the second signal with at least one first peaking amplifier operated in a second amplifier class that is different from the first amplifier class, the second circuit branch being in parallel with the first circuit branch;
amplifying, in the third circuit branch, the third signal with a plurality of second peaking amplifiers operated in the second amplifier class;
combining outputs from the main amplifier and the at least one first peaking amplifier and providing the combined outputs to an impedance inverter;
combining, at a combining node, an output from the impedance inverter and a combined output from the plurality of second peaking amplifiers; and
providing an output from the combining node to an output port of the multiclass power amplifier.

15. The method of claim 14, further comprising presenting approximately a same impedance to the main amplifier irrespective of whether the at least one first peaking amplifier and the plurality of second peaking amplifiers are fully amplifying or are idle.

16. The method of claim 14, further comprising exhibiting a peak efficiency for the power amplifier that occurs between 6 dB and 12 dB output power back-off.

17. The method of claim 14, further comprising delaying, by the impedance inverter, a phase of a carrier wave passing through the impedance inverter by a value that is approximately equal to an odd multiple of 90 degrees.

18. The method of claim 14, further comprising transforming, with an impedance-matching element, an impedance between the combining node and an output of the power amplifier.

19. The method of claim 14, wherein amplifying, in the first circuit branch, the first signal comprises operating the main amplifier in class AB mode.

20. The method of claim 14, wherein amplifying, in the second circuit branch, the second signal comprises operating the at least one first peaking amplifier in class C mode.

21. The method of claim 14, further comprising amplifying, with the power amplifier, communication signals in a cell phone base station.

22. The method of claim 14, further comprising amplifying, with the power amplifier, a communication signal for a cell phone or wireless communication device.

* * * * *